(12) United States Patent
Nin

(10) Patent No.: US 8,423,851 B2
(45) Date of Patent: Apr. 16, 2013

(54) MEASURED DEVICE AND TEST SYSTEM UTILIZING THE SAME

(75) Inventor: Shu-Liang Nin, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 359 days.

(21) Appl. No.: 12/884,041

(22) Filed: Sep. 16, 2010

(65) Prior Publication Data
US 2012/0068719 A1    Mar. 22, 2012

(51) Int. Cl.
| | |
|---|---|
| G01R 31/28 | (2006.01) |
| G01R 27/28 | (2006.01) |
| G01R 31/00 | (2006.01) |
| G01R 31/14 | (2006.01) |
| G06F 11/00 | (2006.01) |
| G06F 1/04 | (2006.01) |
| G06F 1/24 | (2006.01) |
| G06F 1/00 | (2006.01) |
| G11B 27/00 | (2006.01) |
| H03M 13/00 | (2006.01) |
| H04L 7/00 | (2006.01) |
| G01L 15/00 | (2006.01) |
| H01L 23/58 | (2006.01) |
| H01L 29/10 | (2006.01) |

(52) U.S. Cl.
USPC .......... 714/744; 714/724; 714/731; 714/746; 714/798; 714/814; 702/117; 702/118; 702/121; 713/503; 257/48

(58) Field of Classification Search ................. None
See application file for complete search history.

(56) References Cited

U.S. PATENT DOCUMENTS

| | | | |
|---|---|---|---|
| 5,606,567 A * | 2/1997 | Agrawal et al. | 714/732 |
| 7,168,032 B2 * | 1/2007 | Roth et al. | 714/798 |
| 7,287,105 B1 * | 10/2007 | Owen et al. | 710/52 |
| 7,379,395 B2 * | 5/2008 | Gage et al. | 368/118 |
| 2006/0242506 A1 * | 10/2006 | Warnock et al. | 714/726 |
| 2008/0109690 A1 * | 5/2008 | Park | 714/732 |
| 2008/0282110 A1 * | 11/2008 | Guettaf | 714/30 |
| 2010/0188102 A1 * | 7/2010 | Kaiwa et al. | 324/601 |
| 2011/0128052 A1 * | 6/2011 | Fujibe et al. | 327/117 |

* cited by examiner

*Primary Examiner* — Guerrier Merant

(57) ABSTRACT

A measured device coupled to test equipment providing at least two test factors and receiving a test result is disclosed. The measured device includes a combinatorial logic circuit and a main circuit. The combinatorial logic circuit includes a first storage module and a second storage module. The first storage module stores the test factors according to a first operation clock. The second storage module stores and outputs at least two output factors according to a second operation clock. The frequency of the second operation clock is higher than the frequency of the first operation clock. When the test factors are stored in the first storage module, the test factors stored in the first storage module are served as the output factors and the output factors are output and stored in the second storage module. The main circuit generates the test result according to the output factors output by the second storage module. The test equipment obtains information as to whether the main circuit is normal according to the test result.

14 Claims, 7 Drawing Sheets

MEASURED DEVICE AND TEST SYSTEM UTILIZING THE SAME

BACKGROUND OF THE INVENTION

1. Field of the Invention

This invention relates to a testing system, and more particularly to a testing system which utilizes low frequency test equipment to test a measured device with high frequency.

2. Description of the Related Art

The semiconductor integrated circuit (IC) field has quickly matured for a long time. With the technology of materials and design developments, ICs in each generation have become smaller and more complex than previous generations. To increase IC effect, the operation frequency of ICs have become increasingly high in recent years.

To ensure that an IC can normally operate, test equipment is generally utilized to test the IC. The test equipment provides test signals. The IC receives the test signals and generates a test result according to the test signals. The test equipment obtains information as to whether the IC is normal according to the test signals. If the operation frequency of the IC is high, the operation frequency of the test equipment is required to be high, as it is dependant on the operation frequency of the IC. However, test equipment with high operation frequency is expensive.

BRIEF SUMMARY OF THE INVENTION

In accordance with an embodiment, a measured device is coupled to test equipment providing at least two test factors and receiving a test result and comprises a combinatorial logic circuit and a main circuit. The combinatorial logic circuit comprises a first storage module and a second storage module. The first storage module stores the test factors according to a first operation clock. The second storage module stores and outputs at least two output factors according to a second operation clock. The frequency of the second operation clock is higher than the frequency of the first operation clock. When the test factors are stored in the first storage module, the test factors stored in the first storage module are served as the output factors and the output factors are output and stored in the second storage module. The main circuit generates the test result according to the output factors output by the second storage module. The test equipment obtains information as to whether the main circuit is normal according to the test result.

In accordance with another embodiment, a test system comprises test equipment and a measured device. The test equipment provides at least two test factors according to a first operation clock. The measured device receives the test factors to generate a test result and comprises a combinatorial logic circuit and a main circuit. The combinatorial logic circuit comprises a first storage module and a second storage module. The first storage module stores the test factors according to a first operation clock. The second storage module stores and outputs at least two output factors according to a second operation clock. The frequency of the second operation clock is higher than the frequency of the first operation clock. When the test factors are stored in the first storage module, the test factors stored in the first storage module are served as the output factors and the output factors are output and stored in the second storage module. The main circuit generates the test result according to the output factors output by the second storage module. The test equipment obtains information as to whether the main circuit is normal according to the test result.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising" when used in this specification, specify the presence of stated features, integers steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
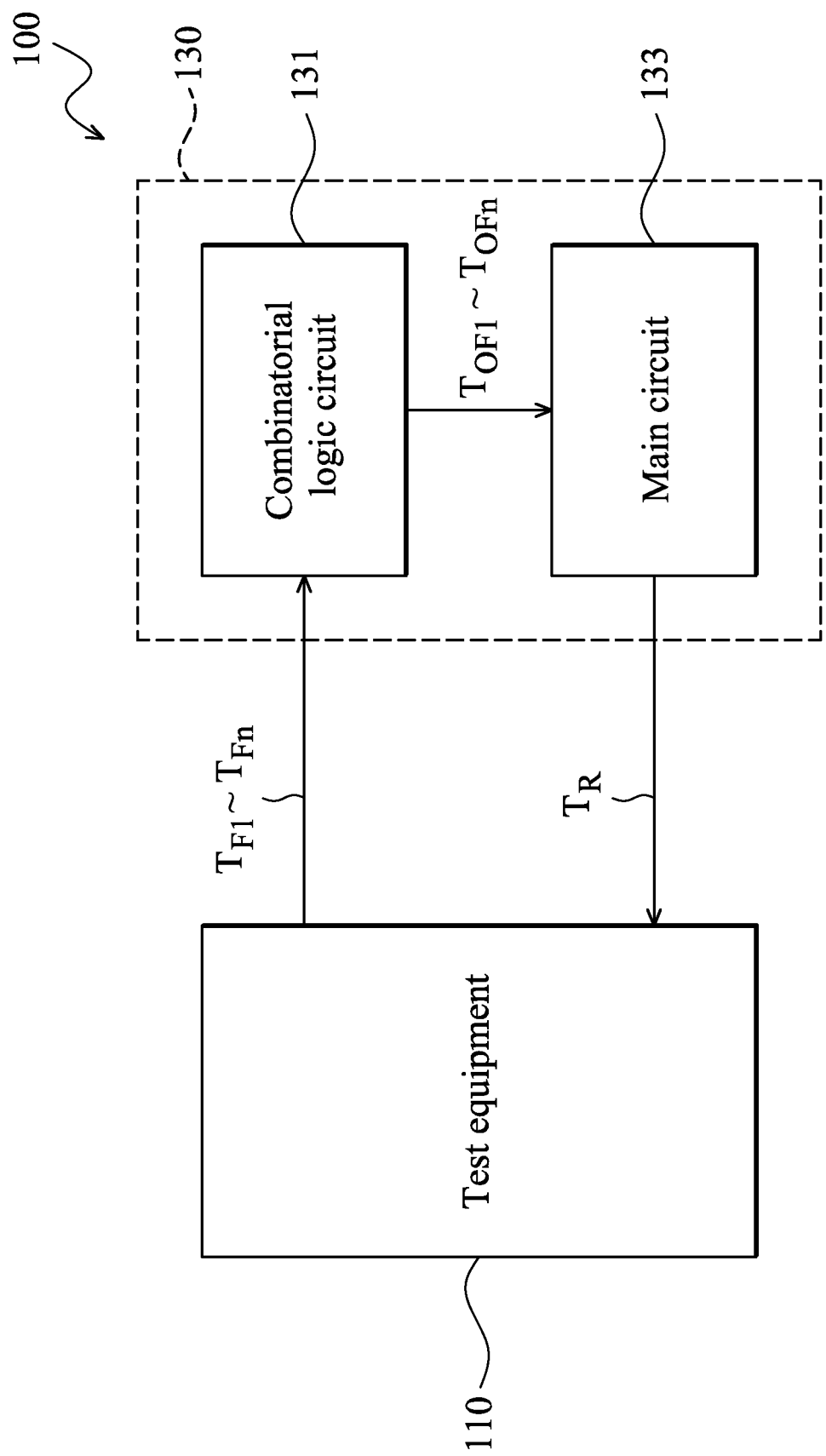
FIG. 1 is a schematic diagram of an exemplary embodiment of a test system.

FIG. 1 is a schematic diagram of an exemplary embodiment of a test system. The test system 100 comprises test equipment 110 and a measured device 130. In this embodiment, the operation frequency of the test equipment 110 is less than the operation frequency of the measured device 130. In one embodiment, the level of the operation frequency of the test equipment 110 may be in MHz and the level of the operation frequency of the measured device 130 may be in GHz, but the disclosure is not limited thereto.

In one embodiment, the test equipment 110 is an automatic test equipment (ATE). The test equipment 110 provides at least two test factors (e.g. $T_{F1} \sim T_{Fn}$) according to a first operation clock. The measured device 130 is coupled to the test equipment 110 and receives the test factors $T_{F1} \sim T_{Fn}$ and generates a test result $T_R$ according to the test factors $T_{F1} \sim T_{Fn}$.

In this embodiment, the measured device 130 comprises a combinatorial logic circuit 131 and a main circuit 133. The combinatorial logic circuit 131 receives the test factors $T_{F1} \sim T_{Fn}$ according to the first operation clock and is served the test factors $T_{F1} \sim T_{Fn}$ into output factors $T_{OF1} \sim T_{OFn}$. The combinatorial logic circuit 131 outputs the output factors $T_{OF1}$~$T_{OFn}$ according to a second operation clock. In this embodiment, the frequency of the second operation clock is higher than that of the first operation clock. The main circuit 133 receives the output factors $T_{OF1}$~$T_{OFn}$ according to the second operation clock and generates a test result $T_R$ according to the output factors $T_{OF1}$~$T_{OFn}$.

In this embodiment, the main circuit 133 executes a specific action according to the output factors $T_{OF1}$~$T_{OFn}$. The invention does not limit the type of the specific action. In this embodiment, the specific action relates to the type of the measured device 130. For example, if the measured device 130 is a storage device (e.g. memory), the specific action executed by the main circuit 133 relates to an access procedure. If the measured device 130 is a processing device (e.g. micro-processor), the specific action relates to a signal process procedure, such as an analog signal process procedure or a digital signal process procedure.

After finishing the specific action, the main circuit 133 generates and provides the test result $T_R$ to the test equipment 110. The test equipment 110 obtains information as to whether the main circuit 133 is normal according to the test result $T_R$. In this embodiment, the main circuit 133 executes the specific action according to the second operation clock and the test equipment 110 provides the test factors $T_{F1}$~$T_{Fn}$ according to the first operation clock. The frequency of the first operation clock is less than that of the second operation clock.

Figure 2:
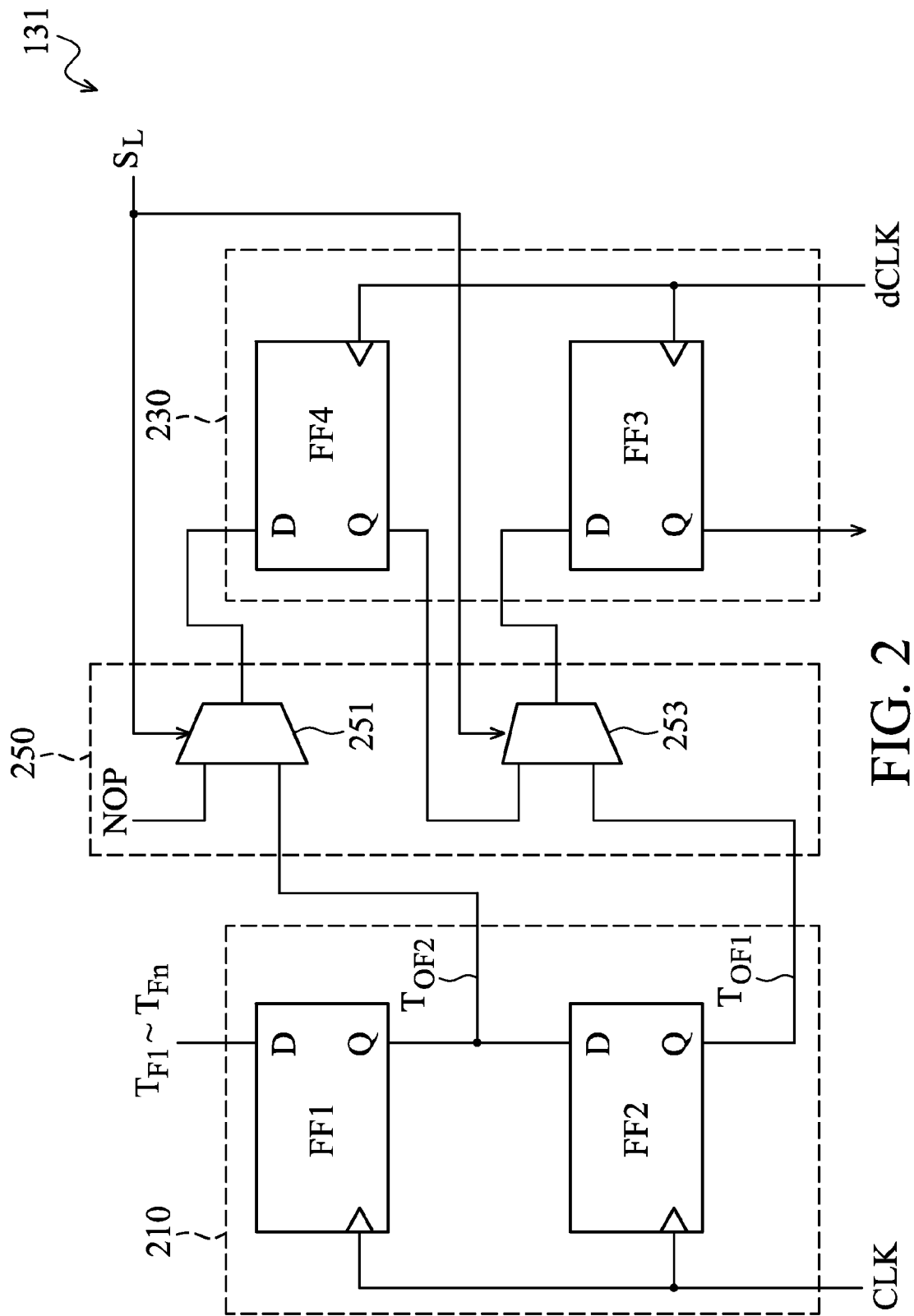
FIG. 2 is a schematic diagram of an exemplary embodiment of the combinatorial logic circuit.

FIG. 2 is a schematic diagram of an exemplary embodiment of the combinatorial logic circuit. The combinatorial logic circuit 131 comprises storage modules 210 and 230. The storage module 210 stores the test factors $T_{F1}$~$T_{Fn}$ according to an operation clock CLK. In one embodiment, the frequency of the operation clock CLK is the same as the operation frequency of the test equipment 110.

The storage module 230 stores at least two output factors $T_{OF1}$~$T_{OFn}$ according to an operation clock dCLK and outputs the stored output factors $T_{OF1}$~$T_{OFn}$ according to the operation clock dCLK. The invention does not limit the source of the operation clocks CLK and dCLK. In one embodiment, the operation clock CLK is provided by the test equipment 110 or generated by a first frequency generator, such as a phase locked loop (PLL). The PLL may be integrated with the measured device 130. Further, the operation clock dCLK may be generated by a second frequency generator. In one embodiment, the frequency generator is integrated with the measured device 130.

The frequency of the operation clock dCLK is higher than the frequency of the operation clock CLK. In one embodiment, the frequency of the operation clock dCLK equals to the frequency of the operation clock CLK multiplied by a constant.

In this embodiment, when the number of the test factors stored in the storage module 210 reaches a predetermined number, the test factors stored in the storage module 210 is output and stored to the storage module 230. The test factors stored in the storage module 230 are referred to as output factors. The storage module 230 outputs the stored output factors to the main circuit 133 according to the operation clock dCLK. The main circuit 133 generates a test result $T_R$ according to the output factors and the operation clock dCLK.

In a conventional test system, if the level of the operation frequency of a measured device is in GHz, the level of the operation frequency of an external test equipment is required to GHz such that the measured device can be accurately tested. If the level of the operation frequency of the external test equipment lags the level of the operation frequency of the measured device, the measured device cannot be accurately tested and the external test equipment cannot receive an accurate test result.

However, the level of the operation frequency of the test equipment 110 can lags that of the measured device 130 in this embodiment. The invention does not limit the operation frequency of the test equipment 110 to be dependant on the operation frequency of the measured device 130. In this embodiment, the level of the operation frequency of the test equipment 110 is in MHz, such as 200 MHz and that of the measured device 130 is in GHz, such as 1.6 GHz. The test equipment 110 provides test factors $T_{F1}$~$T_{Fn}$ according to the operation frequency, such as 200 MHz. The storage module 210 successively receives and stores the test factors $T_{F1}$~$T_{Fn}$ according to the operation frequency (e.g. 200 MHz) of the test equipment 110. The storage module 230 receives and stores the output of the storage module 210 according to the operation frequency (e.g. 1.6 GHz) of the measured device 130, wherein the test factors stored in the storage module 210 is simultaneously output and stored to the storage module 230. The test factors stored in the storage module 230 are referred to as output factors. The storage module 210 outputs the output factors $T_{OF1}$~$T_{OFn}$ (i.e. the test factors $T_{F1}$~$T_{Fn}$) to the main circuit 133 according to the operation frequency (e.g. 1.6 GHz) of the measured device 130. Since the main circuit 133 receives the output factors $T_{OF1}$~$T_{OFn}$ according to the operation frequency (e.g. 1.6 GHz), the main circuit 133 is capable of providing an accurate test result $T_R$ to the test equipment 110.

As shown in FIG. 2, the combination logic circuit 131 further comprises a switching module 250 to appropriately transmit the test factors stored in the storage module 210 into the storage module 230. The invention does not limit the structure of the switching module 250. In other embodiments, any circuit can serve as the switching module 250, as long as the circuits are capable of transmitting the test factors stored in the storage module 210 into the storage module 230.

In this embodiment, the switching module 250 comprises multiplexers 251 and 253. When a load signal $S_L$ is asserted, the multiplexers 251 and 253 transmit the test factors stored in the storage module 210 into the storage module 230. Oppositely, when the load signal $S_L$ is un-asserted, the multiplexers 251 and 253 transmit the null signal NOP (No Operation) to the storage module 230.

In this embodiment, each of the storage modules 210 and 230 comprises at least two registers. The invention does not limit the type and the number of the registers. In one embodiment, each register is a D-type flip-flop. For clarity, only four flip-flops FF1~FF4 are shown in FIG. 2.

During a first period, the flip-flop FF1 stores a first test factor (e.g. $T_{F1}$) among the test factors $T_{F1}$~$T_{Fn}$. At this period, the flip-flop FF2 does not store any test factor.

During a second period following the first period, the first test factor $T_{F1}$ stored in the flip-flop FF1 is output to the flip-flop FF2. Thus, the flip-flop FF2 stores the first test factor $T_{F1}$. At this period, the flip-flop FF1 stores a second test factor (e.g. $T_{F2}$) among the test factors $T_{F1}$~$T_{Fn}$.

During a third period following the second period, the first test factor $T_{F1}$ and the second test factor $T_{F2}$ are simultaneously and respectively transmitted to the flip-flops FF3 and FF4 because both of the flip-flops FF1 and FF2 store test factors. In this embodiment, the first test factor $T_{F1}$ stored in the flip-flop FF2 is served as a first output factor (e.g. $T_{OF1}$) and is transmitted to the flip-flop FF3. Meanwhile, the second test factor $T_{F2}$ stored in the flip-flop FF1 is served as a second output factor (e.g. $T_{OF2}$) and is transmitted to the flip-flop FF4.

During a fourth period following the third period, the storage module 230 successively outputs the first output factor $T_{OF1}$ and the second output factor $T_{OF2}$ to the main circuit 133 according to the operation clock dCLK. In this embodiment, the frequency of the operation clock dCLK is the same as the operation frequency of the main circuit 133.

During a fifth period following the fourth period, the flip-flop FF1 stores a third test factor (e.g. $T_{F3}$) among the test factors $T_{F1}$~$T_{Fn}$. At this period, the flip-flop FF2 does not store any test factor.

During a sixth period following the fifth period, the third test factor $T_{F2}$ stored in the flip-flop FF1 is output to the flip-flop FF2. Thus, the flip-flop FF2 stores the third test factor $T_{F3}$. At this period, the flip-flop FF1 stores a fourth test factor (e.g. $T_{F4}$) among the test factors $T_{F1}$~$T_{Fn}$.

During a seventh period following the sixth period, the third test factor $T_{F3}$ stored in the flip-flop FF2 is served as a third output factor (e.g. $T_{OF3}$) and is transmitted to the flip-flop FF3. Meanwhile, the fourth test factor $T_{F4}$ stored in the flip-flop FF1 is served as a fourth output factor (e.g. $T_{OF4}$) and is transmitted to the flip-flop FF4. The rest may be deduced by analogy.

In this embodiment, the flip-flops FF1~FF4 are positive edge-triggered flip-flops, but the disclosure is not limited thereto. In another embodiment, the flip-flops FF1~FF4 are negative edge-triggered flip-flops.

In other embodiments, the flip-flops FF1 and FF4 are positive edge-triggered flip-flops, and the flip-flops FF2 and FF3 are negative edge-triggered flip-flops. In this case, the frequency of the operation clock received by the flip-flops FF1 and FF2 are the same but the phase of the operation clock received by the flip-flop FF1 is opposite to the phase of the operation clock received by the flip-flop FF2. Similarly, the frequency of the operation clock received by the flip-flops FF3 and FF4 are the same but the phase of the operation clock received by the flip-flop FF3 is opposite to the phase of the operation clock received by the flip-flop FF4.

Figure 3A:
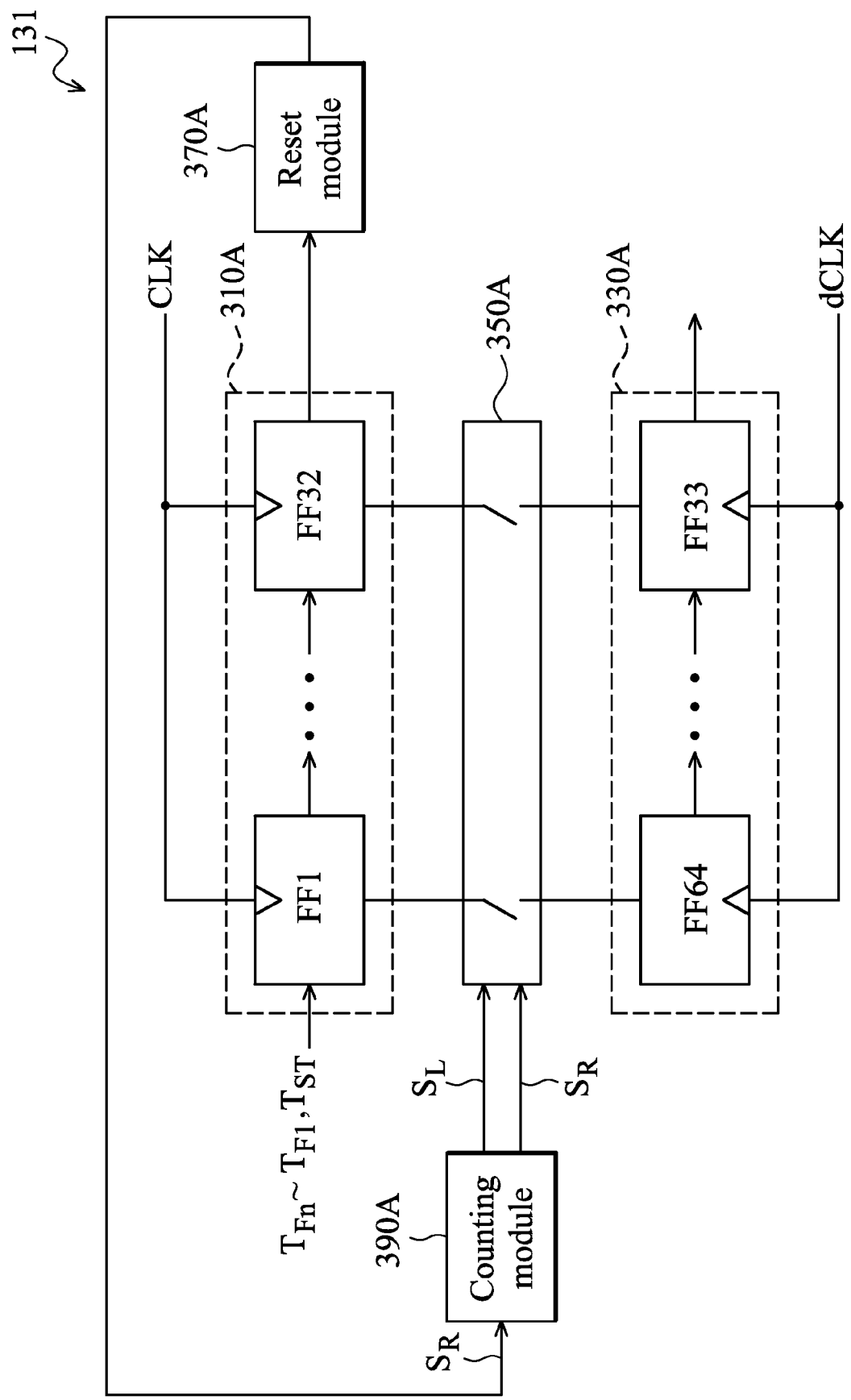
FIGS. 3A~3C and 4 are schematic diagrams of other exemplary embodiments of the combinatorial logic circuit.

FIG. 3A is a schematic diagram of another exemplary embodiment of the combinatorial logic circuit. The combinatorial logic circuit 131 comprises storage modules 310A and 330A, a switching module 350A, a reset module 370A and a counting module 390A.

In this embodiment, the storage module 310A comprises flip-flops FF1~FF32 and the storage module 330A comprises flip-flops FF33~FF64, but the disclosure is not limited thereto. The flip-flops FF1~FF32 are connected in series and the flip-flops FF33~FF64 are connected in series.

The storage module 310A successively receives an initiation factor $T_{ST}$ and test factors $T_{F1}$~$T_{Fn}$ according to the operation clock CLK. The initiation factor $T_{ST}$ and test factors $T_{F41}$~$T^{Fn}$ are provided by the test equipment 110. In this embodiment, when the operation clock CLK comprises a first rising edge, the flip-flop FF1 stores the initiation factor $T_{ST}$. When the operation clock CLK comprises a second rising edge, the flip-flop FF1 outputs the stored initiation factor $T_{ST}$ to the flip-flop FF2. At this time, the flip-flop FF1 stores the test factor $T_{F1}$ and the flip-flop FF2 stores the initiation factor $T_{ST}$.

Then, when the operation clock CLK comprises a third rising edge, the flip-flop FF1 outputs the stored test factor $T_{F1}$ to the flip-flop FF2 and the flip-flop FF2 outputs the stored initiation factor $T_{ST}$ to the flip-flop FF3. At this time, the flip-flop FF1 stores the test factor $T_{F2}$, the flip-flop FF2 stores the test factor $T_{F1}$ and the flip-flop FF3 stores the initiation factor $T_{ST}$.

When the operation clock CLK comprises a thirty-third rising edge, the flip-flops FF1~FF32 respectively store the test factors $T_{F32}$~$T_{F1}$ and the reset module 370A receives the initiation factor $T_{ST}$. In this embodiment, when the reset module 370A receives the initiation factor $T_{ST}$, the flip-flops FF1~FF3 have respectively stored the test factors $T_{F32}$~$T_{F1}$. Thus, the reset module 370A generates a reset signal $S_R$.

In one embodiment, the reset module 370A generates the reset signal $S_R$ to trigger the switching module 350A such that the test factors $T_{F32}$~$T_{F1}$ stored in the flip-flops FF1~FF32 are simultaneously transmitted and stored in the flip-flops FF64~FF33. At this time, the counting module 390A is reset by the reset signal $S_R$ and starts to count. When the counted number reaches a predetermined value, the counting module 390A generates a load signal $S_L$ to trigger the switching module 350A so that the switch module 350A may again transmit the test factors (e.g. $T_{F64}$~$T_{F33}$) stored in the storage module 310A into the storage module 330A.

The invention does not limit the type of the reset module 370A. In one embodiment, the reset module 370A is a decoder to determine whether to receive the initiation factor $T_{ST}$. Additionally, in one embodiment, when the reset signal $S_R$ or the load signal $S_L$ is generated, the switching module 350A transmits the test factors stored in the storage module 310A into the storage module 330A.

Figure 3B:
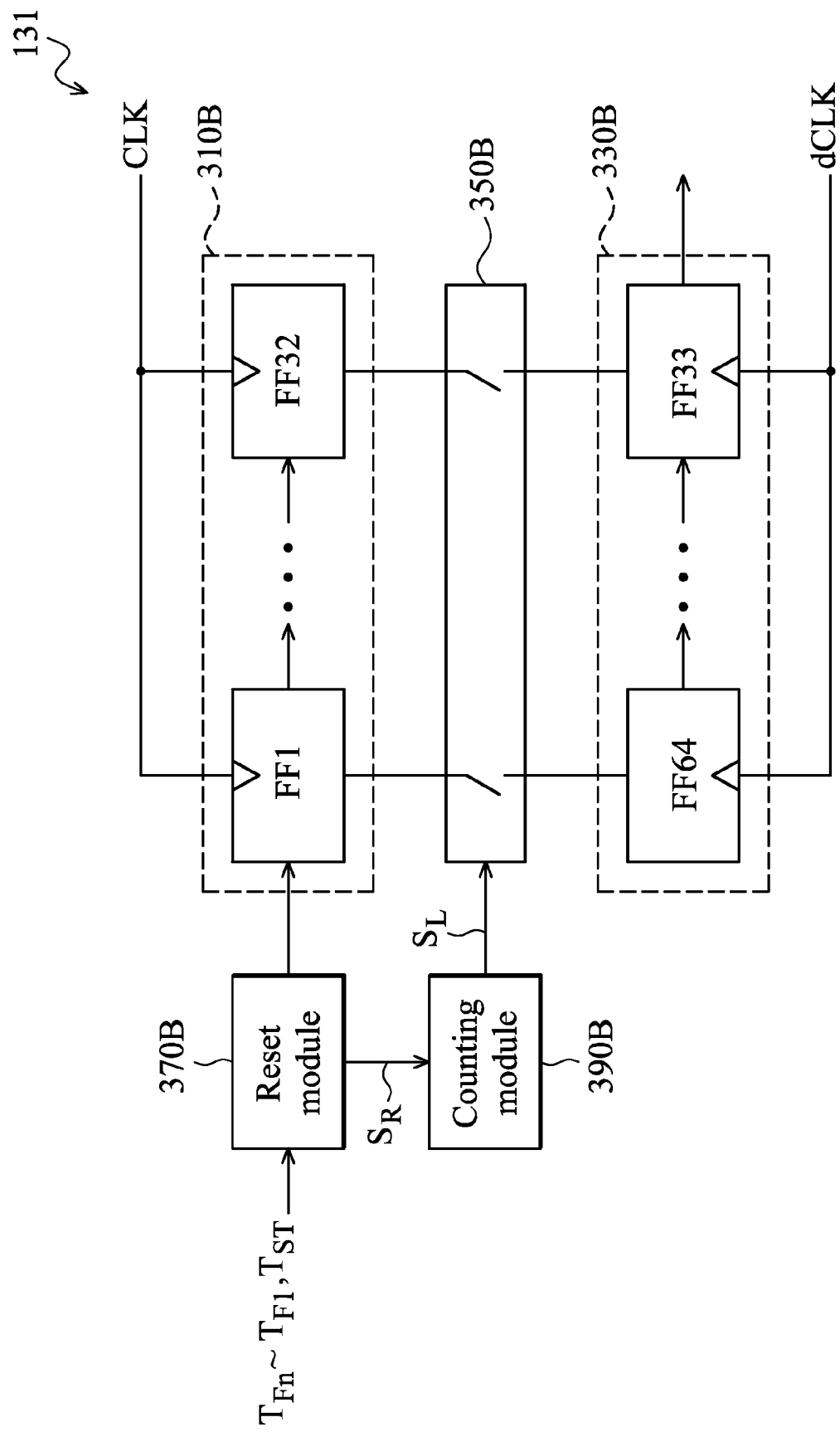

FIG. 3B is a schematic diagram of another exemplary embodiment of the combinatorial logic circuit. FIG. 3B is similar to FIG. 3A with the exception that the reset module 370B of FIG. 3B is disposed before the flip-flop FF1. In this embodiment, when the reset module 370B receives the initiation factor $T_{ST}$, the counting module 390B starts to count.

When the counted number reaches a first predetermined value, the counting module 390B generates a trigger signal $S_L$ to trigger the switching module 350B. The switching module 350B transmits the test factors stored in the storage module 310B to the storage module 330B. In this embodiment, the first predetermined value relates to the number of stored test factors.

When the test factors stored in the storage module 310B are transmitted to the storage module 330B, the counting module 390B is reset and starts to count. When the counted number reaches the first predetermined value, the test factors stored in the storage module 310B is again transmitted to the storage module 330B.

Figure 3C:
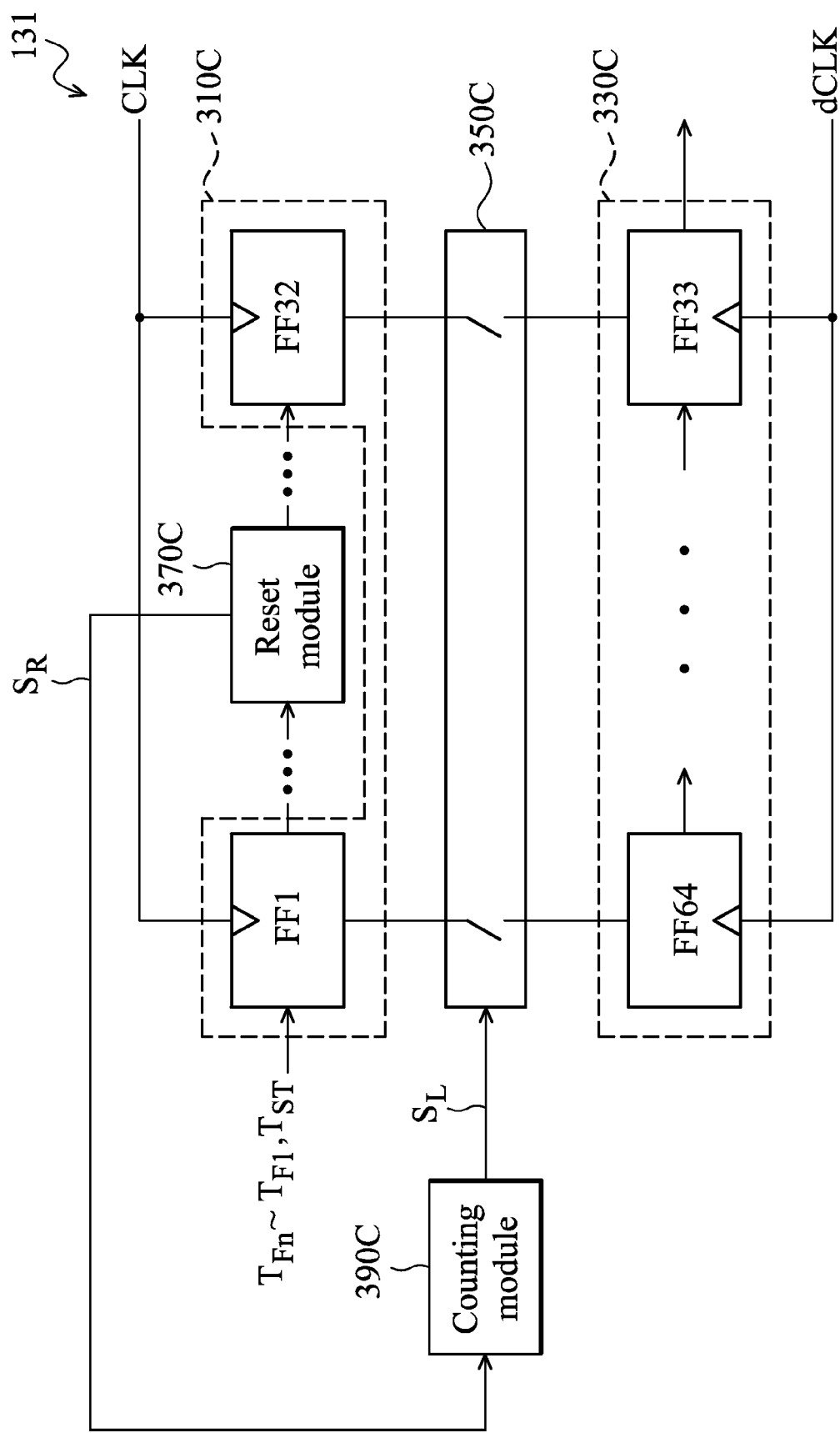

FIG. 3C is a schematic diagram of another exemplary embodiment of the combinatorial logic circuit. FIG. 3C is similar to FIG. 3A with the exception that the reset module 370C of FIG. 3C is disposed between the flip-flops FF1 and FF32. In this embodiment, when the reset module 370C receives the initiation factor $T_{ST}$, the reset module 370C generates a reset signal $S_R$ to reset the counting module 390C and then the counting module 390C starts to count. When the counted number reaches a second predetermined value, the counting module 390C generates a trigger signal $S_L$ to trigger the switching module 350C. The switching module 350C transmits the test factors stored in the storage module 310C to the storage module 330C. In this embodiment, the second predetermined value is less than the first predetermined value and the second predetermined value relates to the disposed position of the reset module 370C.

Figure 4:
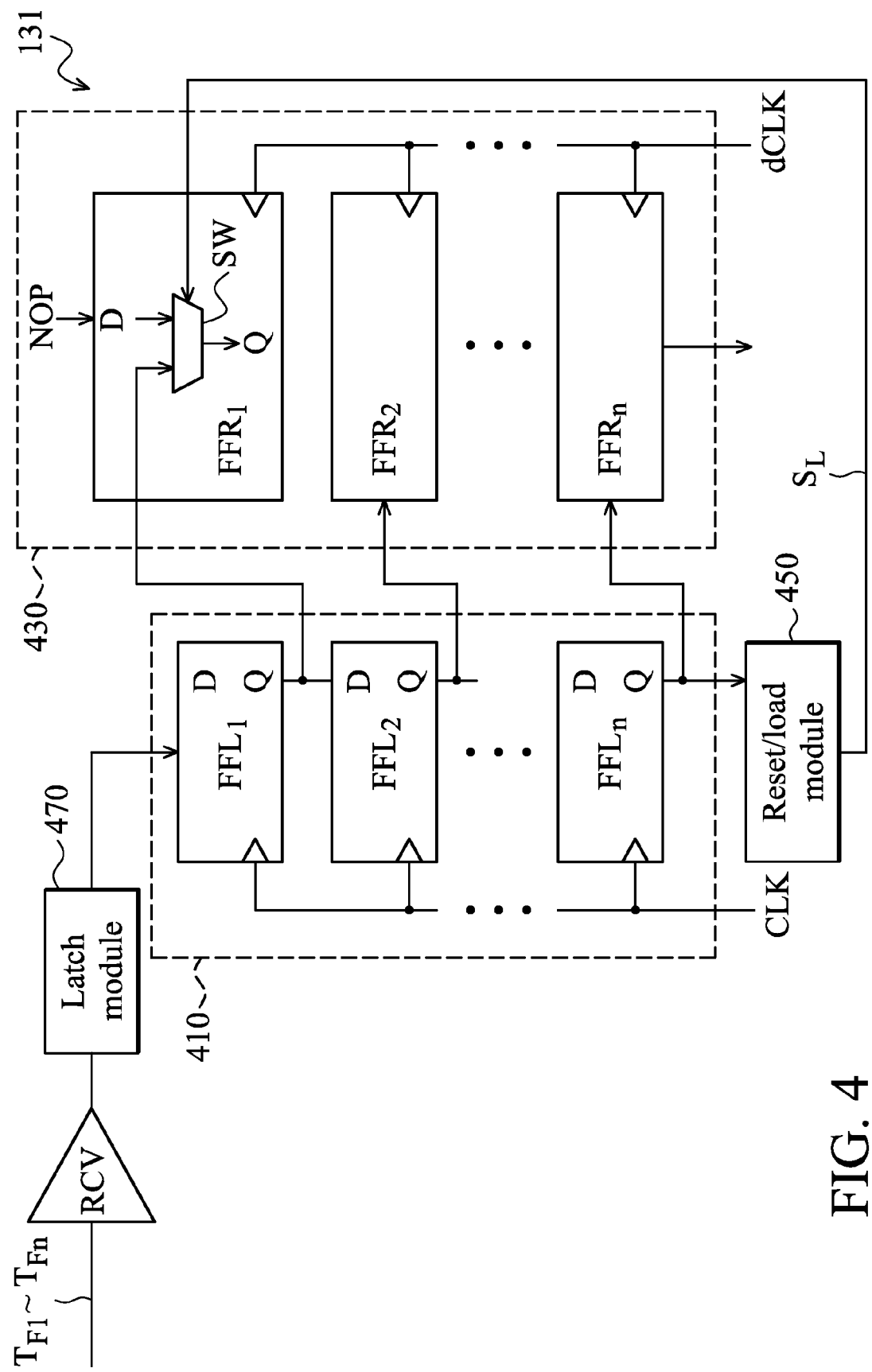

FIG. 4 is a schematic diagram of another exemplary embodiment of the combinatorial logic circuit. The combinatorial logic circuit 131 comprises storage modules 410, 430, a reset/load module 450, a latch module 470 and a receiving module RCV. The receiving module RCV receives the test factors $T_{F1}$~$T_{Fn}$.

In this embodiment, the receiving module RCV transforms the levels of the test factors $T_{F1}$~$T_{Fn}$ and outputs the transformed result. The latch module 470 latches the output of the receiving module RCV and outputs the latched result to the storage module 410. In other embodiments, the receiving module RCV and the latch module 470 can be omitted to reduce cost.

When the number of the test factors stored in the storage module 410 reaches a predetermined number, the reset/load module 450 asserts a load signal $S_L$ so that the test factors stored in the storage module 410 are transmitted to the storage module 430. In this embodiment, the reset/load module 450 comprises the reset module 370A and the counting module 390A in FIG. 3A.

As shown in FIG. 4, each of the flip-flops $FFR_1 \sim FFR_n$ comprises a switch SW. When the load signal $S_L$ is asserted, the flip-flops $FFR_1 \sim FFR_n$ stores the output of the flip-flops $FFL_1 \sim FFL_n$ and then the storage module 430 outputs the stored test factors to a main circuit according to the operation clock dCLK. The frequency of the operation clock dCLK is higher than the frequency of the operation clock CLK received by the storage module 410.

Figure 5:
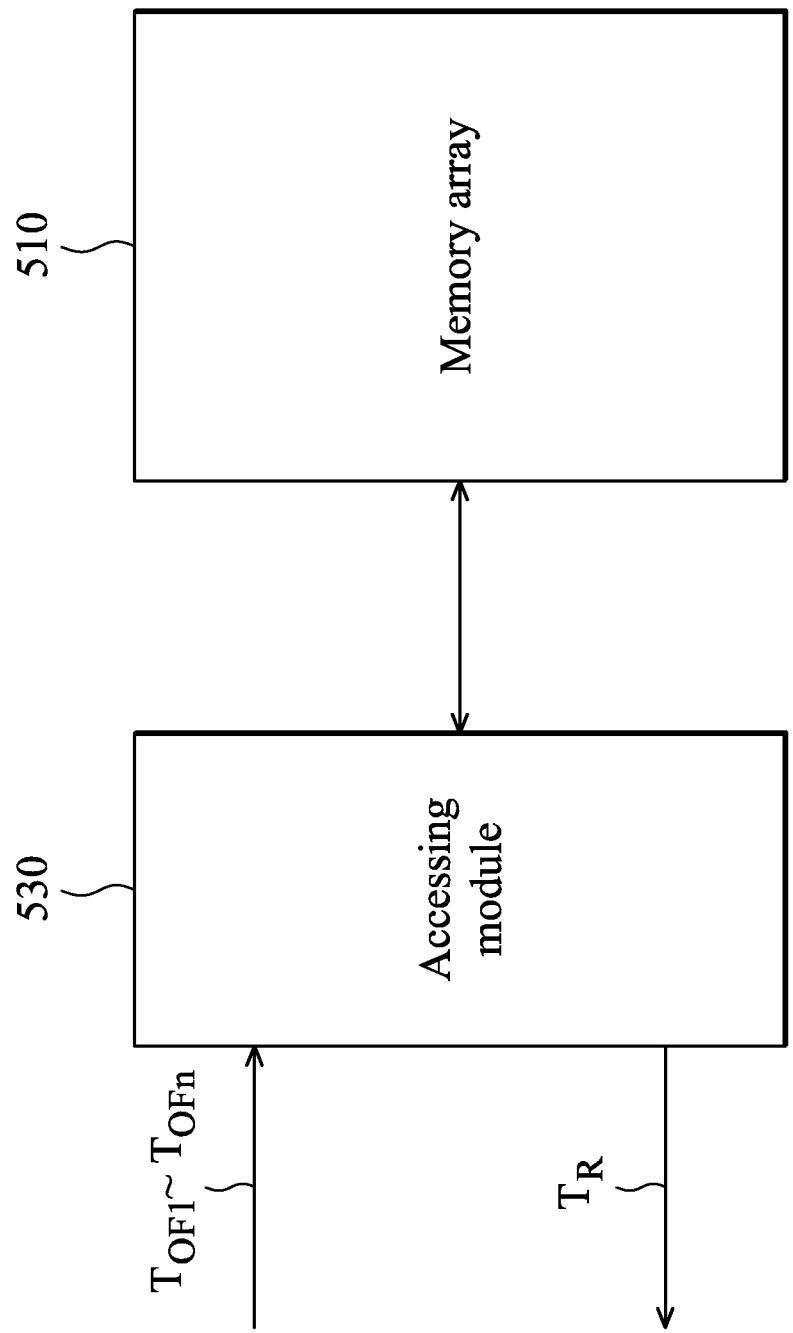
FIG. 5 is a schematic diagram of an exemplary embodiment of a main circuit.

FIG. 5 is a schematic diagram of an exemplary embodiment of a main circuit. In this embodiment, the main circuit comprises a memory array 510 and an accessing module 530, but the disclosure is not limited thereto. The memory array 510 comprises a plurality of cells. The accessing module 530 executes an access procedure for the memory array 510 according to the output factors $T_{OF1} \sim T_{OFn}$. The accessing module 530 generates a test result $T_R$. An external test equipment obtains information as to whether the main circuit is normal according to the test result $T_R$.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A measured device coupled to test equipment providing at least two test factors and receiving a test result, comprising:
   a combinatorial logic circuit comprising:
   a first storage module storing the test factors according to a first operation clock;
   a second storage module storing and outputting at least two output factors according to a second operation clock, wherein the frequency of the second operation clock is higher than the frequency of the first operation clock;
   wherein when the test factors are stored in the first storage module, the test factors stored in the first storage module are served as the output factors and the output factors are output and stored in the second storage module; and
   a main circuit generating the test result according to the output factors output by the second storage module, wherein the test equipment obtains information as to whether the main circuit is normal according to the test result,
   wherein the first storage module comprises at least two flip-flops,
   during a first period, a first flip-flop of the first storage module stores a first test factor among the test factors; and
   during a second period following the first period, the first test factor stored in the first flip-flop is output to a second flip-flop of the first storage module and the first flip-flop stores a second test factor among the test factors,
   wherein the second storage module comprises at least two flip-flops, and
   during a third period following the second period, the first test factor stored in the second flip-flop is served as a first output factor among the output factors and the first output factor is output and stored in a third flip-flop of the second storage module, and the second test factor stored in the first flip-flop is served as a second output factor among the output factors and the second output factor is output and stored in a fourth flip-flop of the second storage module.

2. The measured device as claimed in claim 1, wherein the first, the second, the third and the fourth flip-flops are positive edge-triggered flip-flops.

3. The measured device as claimed in claim 1, wherein the first, the second, the third and the fourth flip-flops are negative edge-triggered flip-flops.

4. The measured device as claimed in claim 1, wherein the first and the fourth flip-flops are positive edge-triggered flip-flops, and the second and third flip-flops are negative edge-triggered flip-flops.

5. The measured device as claimed in claim 1, wherein the test equipment further provides an initiation factor and comprises:
   a reset module generating a reset signal when the reset module receives the initiation factor; and
   a counting module starting to count when the counting module receives the reset signal, wherein when the counted value reaches a predetermined value, the test factors stored in the first storage module are served as the output factors and output to the second storage module.

6. The measured device as claimed in claim 5, wherein each of the first and the second storage modules comprises a plurality of registers, the number of the registers of the first storage module is the same as the number of the registers of the second storage module and the predetermined value is defined according to the number of the registers of the first storage module.

7. The measured device as claimed in claim 1, wherein the main circuit comprises:
   a memory array comprising a plurality of cells; and
   an accessing module accessing the cells according to the output factors output from the second storage module, wherein the accessed result is served as the test result.

8. A test system comprising:
   test equipment providing at least two test factors according to a first operation clock; and
   a measured device receiving the test factors to generate a test result and comprising:
   a combinatorial logic circuit comprising:
   a first storage module storing the test factors according to the first operation clock; and
   a second storage module storing and outputting at least two output factors according to a second operation clock, wherein the frequency of the second operation clock is higher than the frequency of the first operation clock,
   wherein when the test factors are stored in the first storage module, the test factors stored in the first storage module are served as the output factors and the output factors are output and stored in the second storage module; and
   a main circuit generating the test result according to the output factors output by the second storage module, wherein the test equipment obtains information as to whether the main circuit is normal according to the test result,
   wherein the first storage module comprises at least two flip-flops; and during a first period, a first flip-flop of the first storage module stores a first test factor among the test factors; and during a second period following the first period, the first test factor stored in the first flip-flop is output to a second flip-flop of the first storage module and the first flip-flop stores a second test factor among the test factors, wherein the second storage module comprises at least two flip-flops, and during a third period following the second period, the first test factor stored in the second flip-flop is served as a first output factor among the output factors and the first output factor is output and stored in a third flip-flop of the second storage module, and the second test factor stored in the first flip-flop is served as a second output factor among the output factors and the second output factor is output and stored in a fourth flip-flop of the second storage module.

9. The test system as claimed in claim 8, wherein the first, the second, the third and the fourth flip-flops are positive edge-triggered flip-flops.

10. The test system as claimed in claim 8, wherein the first, the second, the third and the fourth flip-flops are negative edge-triggered flip-flops.

11. The test system as claimed in claim 8, wherein the first and the fourth flip-flops are positive edge-triggered flip-flops, and the second and third flip-flops are negative edge-triggered flip-flops.

12. The test system as claimed in claim 8, wherein the test equipment further provides an initiation factor and comprises:

a reset module generating a reset signal when the reset module receives the initiation factor; and a counting module starting to count when the counting module receives the reset signal, wherein when the counted value reaches a predetermined value, the test factors stored in the first storage module are served as the output factors and output to the second storage module.

13. The test system as claimed in claim 12, wherein each of the first and the second storage modules comprises a plurality of registers, the number of the registers of the first storage module is the same as the number of the registers of the second storage module and the predetermined value is defined according to the number of the registers of the first storage module.

14. The test system as claimed in claim 8, wherein the main circuit comprises:

a memory array comprising a plurality of cells; and an accessing module accessing the cells according to the output factors output from the second storage module, wherein the accessed result is served as the test result.

* * * * *